(12) United States Patent
Lam

(10) Patent No.: US 8,174,099 B2
(45) Date of Patent: May 8, 2012

(54) LEADLESS PACKAGE WITH INTERNALLY EXTENDED PACKAGE LEADS

(75) Inventor: Ken Lam, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 50 days.

(21) Appl. No.: 12/191,188

(22) Filed: Aug. 13, 2008

(65) Prior Publication Data

US 2010/0038759 A1 Feb. 18, 2010

(51) Int. Cl.
*H01L 23/495* (2006.01)
*H01L 23/535* (2006.01)

(52) U.S. Cl. .............. 257/676; 257/666; 257/E23.039

(58) Field of Classification Search .............. 257/666, 257/676, E23.039
See application file for complete search history.

(56) References Cited

U.S. PATENT DOCUMENTS

| | | | |
|---|---|---|---|
| 5,334,873 A * | 8/1994 | Cha | 257/666 |
| 5,360,992 A * | 11/1994 | Lowrey et al. | 257/666 |
| 5,559,305 A * | 9/1996 | Lee et al. | 174/537 |
| 5,844,310 A * | 12/1998 | Okikawa et al. | 257/712 |
| 5,907,186 A * | 5/1999 | Kang et al. | 257/676 |
| 5,973,935 A * | 10/1999 | Schoenfeld et al. | 361/813 |
| 6,052,289 A * | 4/2000 | Schoenfeld et al. | 361/813 |
| 6,664,615 B1 | 12/2003 | Bayan et al. | |
| 6,882,032 B2 * | 4/2005 | Stroupe | 257/666 |
| 7,060,535 B1 | 6/2006 | Sirinorakul et al. | |
| 7,132,314 B2 * | 11/2006 | Matsunami | 438/123 |
| 7,449,368 B2 * | 11/2008 | Stroupe | 438/119 |
| 7,466,012 B2 * | 12/2008 | Standing et al. | 257/666 |
| 2002/0168796 A1 * | 11/2002 | Shimanuki et al. | 438/106 |
| 2003/0193081 A1 * | 10/2003 | Schoenfeld et al. | 257/666 |
| 2006/0151860 A1 * | 7/2006 | Islam et al. | 257/676 |
| 2006/0278964 A1 | 12/2006 | Anacleto et al. | |
| 2007/0075409 A1 | 4/2007 | Letterman et al. | |
| 2007/0111374 A1 * | 5/2007 | Islam et al. | 438/106 |

* cited by examiner

*Primary Examiner* — Fernando L Toledo
*Assistant Examiner* — John P Dulka
(74) *Attorney, Agent, or Firm* — Fish & Richardson P.C.

(57) ABSTRACT

A DFN package includes internally extended package leads. One or more package pads are physically and electrically extended from a first edge of the package to a second, opposite edge of the package. These extended package leads can terminate at the edges of the leadframe. The package pads and the extended package leads where the IC die is attached can have full leadframe thickness. Other extended package lead features can have a reduced leadframe thickness (e.g., about half the leadframe thickness). Leadframe features can be physically and electrically connected to a tie-bar feature which can be an integral part of a leadframe matrix. The tie-bar can stabilize the leadframe features during assembly. The tie-bar can also provide electrical connectivity for post assembly leadframe plating. The tie-bar can be removed during package singulation by sawing or punching techniques to free the leadframe features both physically and electrically.

9 Claims, 6 Drawing Sheets

US 8,174,099 B2

LEADLESS PACKAGE WITH INTERNALLY EXTENDED PACKAGE LEADS

TECHNICAL FIELD

This subject matter is generally related to lead frame based integrated circuit (IC) packages.

BACKGROUND

Leadless packages, such as the Dual Flat No-Lead (DFN) and Quad Flat No-Lead (QFN) package layouts, are built upon an etched or stamped leadframe. The leadframe structure, commonly a metal (e.g., copper) strip, allows the exposed die pads and exposed leads to be locked into place during fabrication. The leadframe structure can be arranged in a step-and-repeat matrix of leadframe cells. Multiple leadless packages can be fabricated upon a leadframe matrix.

Electrically conductive leads are connected to a tie-bar feature to secure them in position. Bond pads can be created from the leads (e.g., the tips of the leads). The IC die is attached to a Die-attach Paddle (DAP) situated in the center of the leadless package, for example using an organic compound (e.g., epoxy). The wire bond pads of the IC die are then connected to the bond pads of the leadless package and wire bonded, for example, using standard wire bonding techniques. Once the die is attached to the leadframe, the package is encapsulated with a mold compound (e.g., plastic, epoxy or ceramic, etc.) and then cured. The cured hardened mold compound forms a rigid structure to hold the leadframe features in position. Individual leadless packages can be singulated from the tie-bar at this point, for example by using a sawing or punching technique.

The conventional DFN packaging solutions described above fail to provide flexible connection options when electrically connecting IC die to a leadframe cell during assembly of the DFN package.

SUMMARY

A DFN package includes internally extended package leads to provide a flexible IC package. One or more package leads are physically and electrically extended from a first edge of the package to a second, opposite edge of the package. These extended package leads can terminate at the edges of the leadframe. The package pads and the extended package leads where the IC die is attached to can have full leadframe thickness. Other extended package lead features can have a reduced leadframe thickness (e.g., about half the leadframe thickness). Leadframe features are physically and electrically connected to a tie-bar feature which is an integral part of a leadframe matrix. After mold cure, the tie-bar can stabilize the leadframe features during assembly. The tie-bar can also provide electrical connectivity for post assembly leadframe plating. The tie-bar can be removed during package singulation by sawing or punching techniques to free the package assembly both physically and electrically. At this step, the leadframe features, IC die, bond-wires, etc., are physically held together by a package mold compound.

The extended package leads provide a flexible package bond-out option without adding a routing die or additional part to the DFN package. The DFN package can accommodate large or small die due to the extended package leads being proximate to the die for wire-bonding. The extended package leads do not alter the DFN package outline dimensions. The DFN package with extended package leads do not have added costs for solder bumping mask sets or solder bump deposition as required by flip-chip-on-lead solutions. Nor does the DFN package with extended package leads change the cost of a standard DFN package, since a DFN with extended package leads is assembled as a standard DFN and therefore will not affect the assembly yield and cycle times.

DETAILED DESCRIPTION

Example Leadframe Design

Figure 1A:
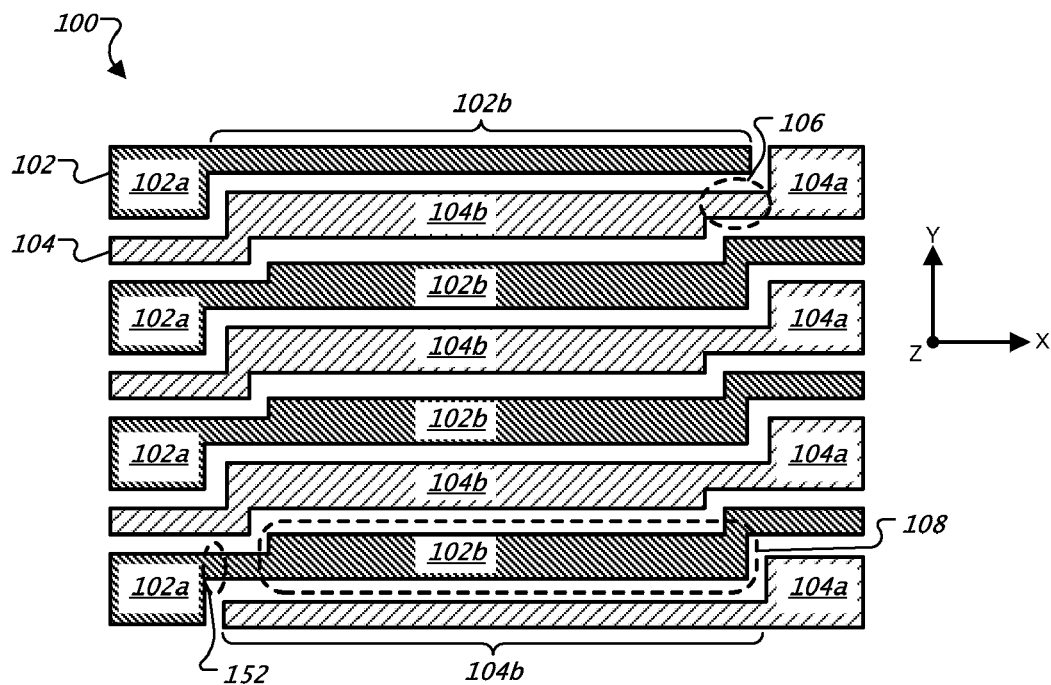
FIGS. 1A and 1B illustrate an example leadframe design with internally extended package leads.
Figure 1B:
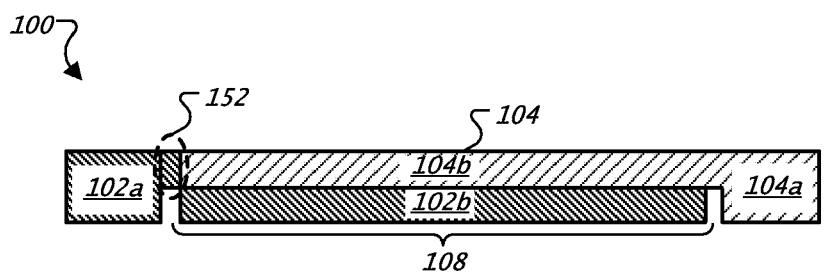

FIGS. 1A and 1B illustrate a leadframe design with internally extended package leads. For simplicity, only a single leadframe cell is shown. The tie-bar feature has also been omitted for clarity. The leadframe design, for example, can be fabricated using standard leadframe fabrication methods like etching or stamping. The leadframe design, in some examples, can be fabricated using copper, copper alloy, aluminum, brass, or iron-nickel alloy.

FIG. 1A shows a top view of an extended lead DFN leadframe cell 100. In some implementations, the leadframe cell 100 can include a number of extended package leads 102, 104, arranged in a plane along a first axis of the plane (e.g., a y-axis). The extended package leads 102, 104, include package pads 102a, 104a and extended portions 102b, 104b, respectively. The extended portions 102b, 104b extend from the package pads 102a, 104a, along a second axis of the plane that is substantially perpendicular to the first axis of the plane (e.g., an x-axis). At least one extended portion 102b, 104b terminates at least partially between adjacent package pads 102a, 104a of alternating extended package leads 102, 104.

In the configuration shown, the leadframe cell 100 includes four left-edge package pads 102a and four right-edge package pads 104a. The left-edge package pads 102a are physically and electrically extended to the right edge of the package, where at least one extended portion 102b terminates at least partially between the right-edge package pads 104a. Similarly, right-edge package pads 104a are physically and electrically extended to the left edge of the package, where at least one extended portion 104b terminates at least partially between the left-edge package pads 102a.

The extended portions 102b, 104b of the extended package leads 102, 104 can provide flexible connection options when electrically connecting an IC die to the leadframe cell 100 during assembly of a DFN package. In some implementations, only select package pads 102a, 104a have extended portions 102b, 104b, that extend to the opposite edge of the package. For example, an upper left package pad 102a and an upper right package pad 104a could have extended portions 102b, 104b, for a DFN package assembly in which ground and power signals are to be relocated. In some implementations, at least one of the extended portions 102b, 104b, can terminate earlier than the opposite edge of the leadframe cell 100. For example, the extended package leads 102, 104 at the top and bottom of the leadframe cell 100 terminate at the package pads 104a, 102a, respectively, and do not extend to the right and left edges of the leadframe cell 100. In some implementations, if a small die is going to be assembled on top of the leadframe cell 100, the extended portions 102b, 104b of the package pads 102a, 104a could be extended to provide connection points proximate to the exterior of the small die.

The extended package leads 102, 104 can include wide and narrow regions. For example, within narrow regions (e.g., a region 106 extending from the upper right-edge package pad 104a), the extension portions can be reduced in thickness (e.g., by etching) from the bottom edge to about half of the leadframe thickness. Within wide regions (e.g., region 108 extending from the lower left-edge package pad 102a), the extended portions 102b, 104b, can have full leadframe thickness. The full leadframe thickness provides stability for the leadframe extensions during fabrication. The narrow portions of the extended portions 102b, 104b which are electrically and physically connected to the leadframe tie-bars will be separated from the tie-bars by sawing or punching techniques.

FIG. 1B illustrates a bottom edge view of the leadframe cell 100 of FIG. 1A. The bottom edge view shows the lower two package pads 102a and 104a. Where the extended portion 104b terminates, the beginning region 152 of the extended portion 102b is visible. Because the extended portion 104b has been etched to a reduced leadframe thickness (e.g., about ½ full leadframe thickness), the full leadframe thickness of the region 108 of the extended portion 102b is visible. At the time of fabrication, features of the extended package leads 102, 104 (e.g., package pads 102a, 104a and extended portions 102b, 104b) are electrically and physically connected to tie-bar features of a leadframe matrix. The tie-bar matrix provides physical stability to the leadframe features during fabrication.

Example Assembly Steps

Figure 2A:
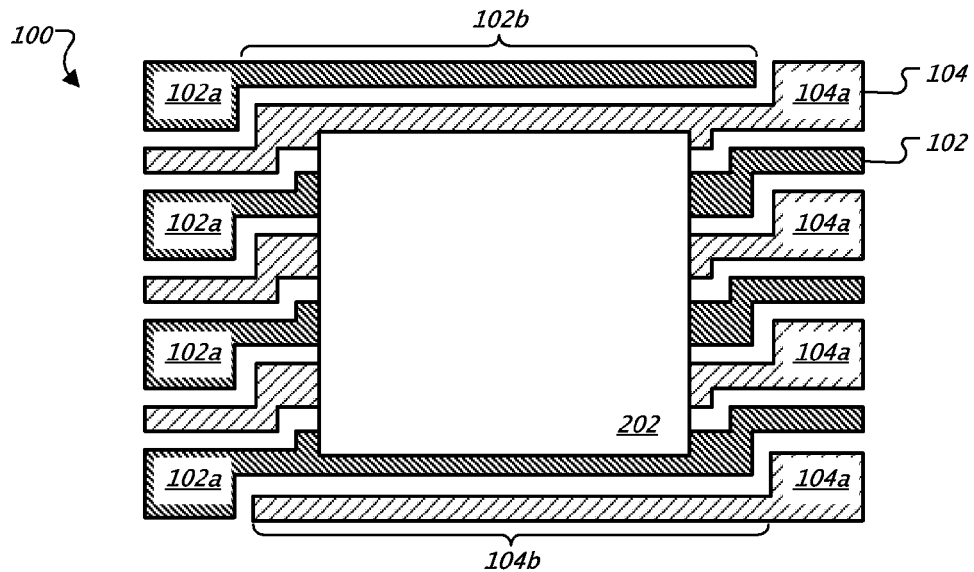
FIGS. 2A through 2F illustrate steps for assembling an example DFN package with internally extended package leads.
Figure 2B:
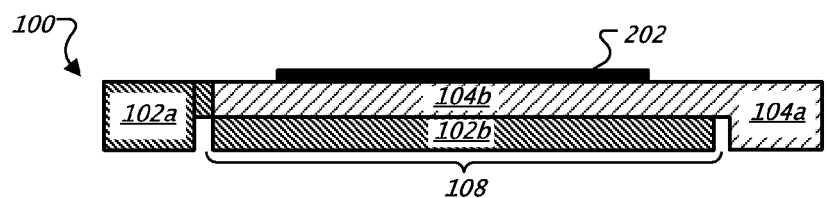

FIGS. 2A through 2F illustrate steps for assembling a DFN package with internally extended package leads. In FIG. 2A, the leadframe cell 100 (as described in FIG. 1A) is overlaid by a non-conductive die-attach adhesive 202 (e.g., paste or film). FIG. 2B illustrates a bottom edge view of the leadframe cell 100 of FIG. 2A. The die-attach adhesive 202, as shown in FIG. 2B, forms a thin film over a portion of the leadframe cell 100. The die-attach adhesive 202, for example, can coat approximately the footprint area of the die being attached.

Figure 2C:
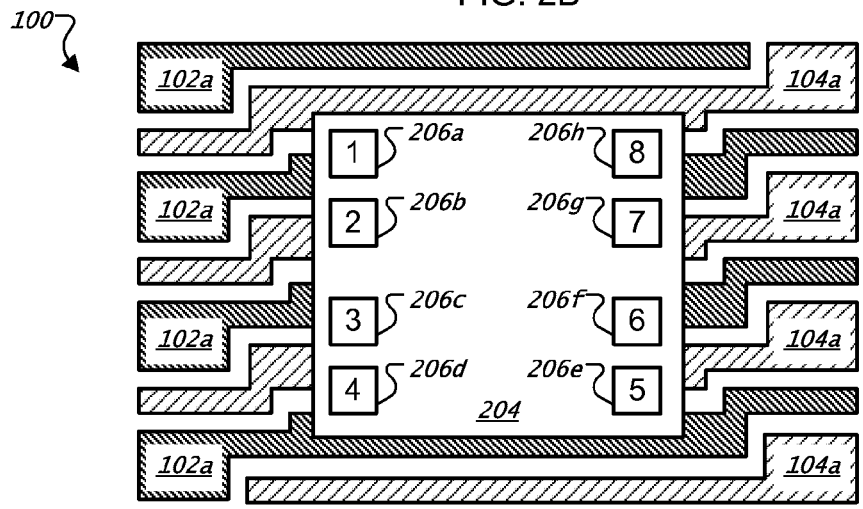
Figure 2D:
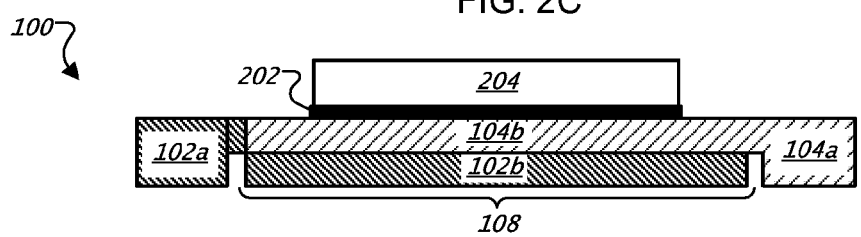

An IC die 204, as shown in FIG. 2C, is attached to the top edge of the leadframe cell 100 using the die-attach adhesive 202. For example, the die 204 can be cured in place to the leadframe cell 100 using the die-attach adhesive 202. The die 204 includes a set of bond pads 206. FIG. 2D illustrates the layering of the die 204 on top of the die-attach adhesive 202 which is layered on top of the leadframe cell 100.

Figure 2E:
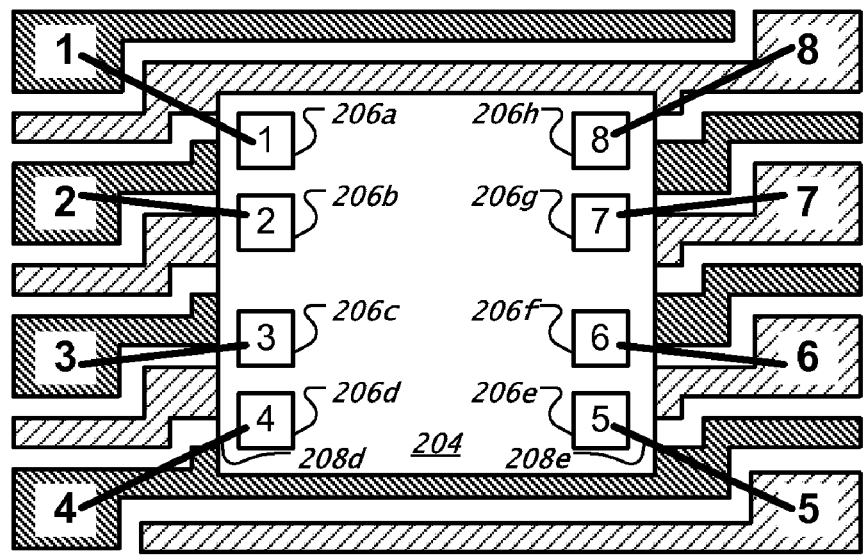
Figure 2F:
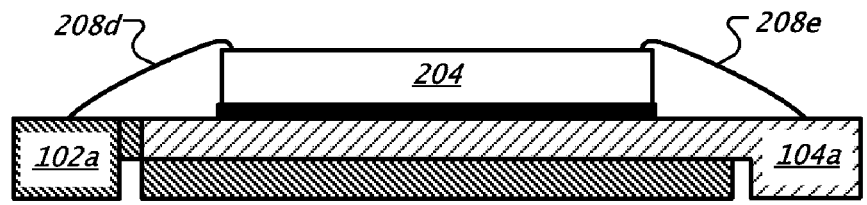

To electrically connect the die 204 to the leadframe cell 100, wire bonds 208 are formed between the bond pads 206 and the package pads. As shown in FIG. 2E, the wire bonds 208 connect each bond pad 206 to the nearest package pad. For example, wire bond 208d connects die pad 206d to the bottom left bond pad (bond pad "4"). This wire bonding layout preserves the original signal positioning of the die 204. The wire bonds 208 can be attached using traditional wire bonding techniques. A bottom edge view of the leadframe cell 100, as illustrated in FIG. 2F, shows the wire bond 208d connecting the die 204 to the bottom left package pad (package pad 4) and wire bond 208e connecting the die 204 to the bottom right package pad (package pad 5). In some implementations, the assembled leadframe cell 100 can be molded and singulated into individual DFN packages. Additional fabrication and/or assembly steps are possible. For example, the leadframe can be plated post-assembly before the package is molded and singulated.

Example Wire-Bonding Method

Figure 3A:
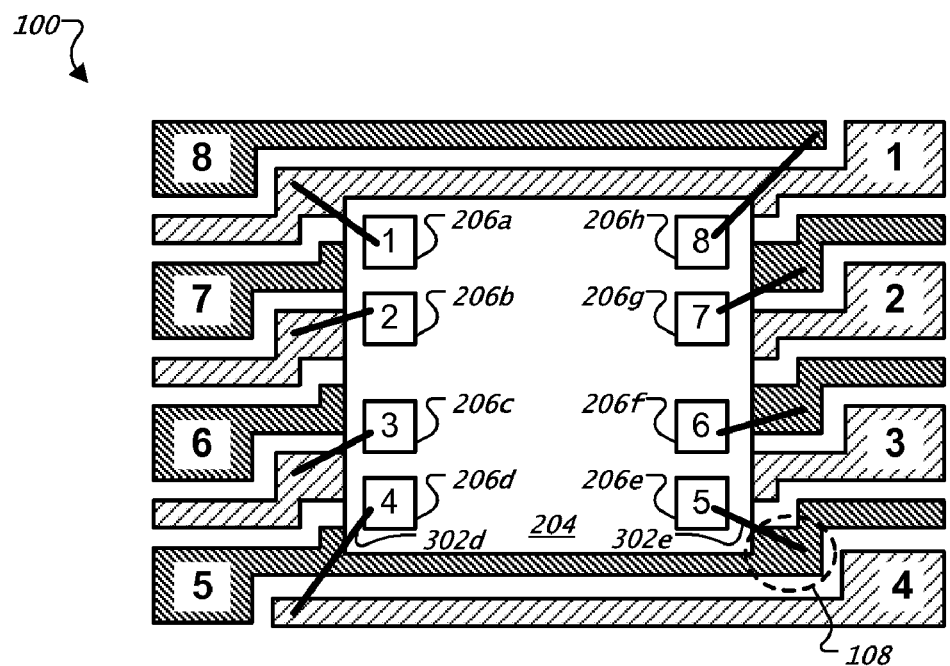
FIGS. 3A and 3B illustrate an alternative example of a wire bonding method for assembling a DFN package with internally extended package leads.
Figure 3B:
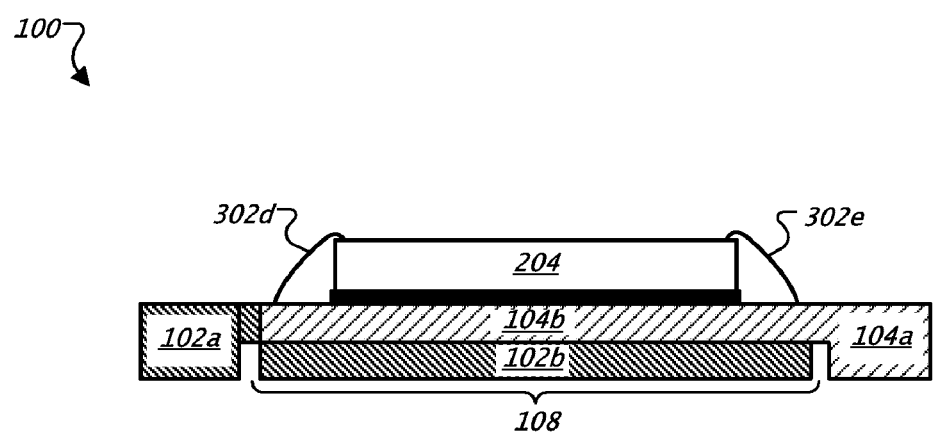

FIGS. 3A and 3B illustrate an alternative wire bonding method for assembling a DFN package with internally extended package leads. The die 204 is mounted to the leadframe cell 100. In some implementations, the DFN package could have been fabricated to this point using the methods described in FIGS. 2A-2D. In FIG. 3A, wire bonds 302 are connected to the extended portions of the package pads. In this manner, the signal layout of the die 204 can be reversed (e.g., routed to the opposite edge of the die orientation). The leftmost bond pads 206a through 206d are connected to the extended portions of the rightmost package pads with wire bonds 302a through 302d. Similarly, the rightmost bond pads 206e through 206h are connected to the extended portions of the leftmost package pads with wire bonds 302e through 302h. In this way, for example, the bond pad 206a can be accessed through the upper right package pad 1. When possible, the wire bonds 302 are connected to the wide regions of the extended portions to provide greater stability in the leadframe cell 100 during the wire bonding process. For example, the wire bond 302e is connected from the bond pad 206e to the wide region 108 of the extended portion of the bottom left package pad 5.

As shown in FIG. 3B, a bottom edge view of the leadframe cell 100 illustrates the die 204 connected to the leadframe cell 100 by wire bonds 302d and 302e. As compared to the bottom edge view of the leadframe cell 100 in FIG. 2F, wire bonds 302d and 302e are shorter and connected closer to the edges of the die 204.

In some implementations, a very small die or a very large die can be attached to the leadframe 100, because the leadframe extensions 102b, 104b provide the opportunity to connect at any position across the leadframe cell 100. For example, if a very small die is assembled on top of the leadframe cell 100, the die could be attached to the leadframe extensions 102b, 104b of the package pads 102a, 104a even when attaching the bond pads 206 to the same signal layout as the package pads 102a, 104a (e.g., the layout as illustrated in FIG. 2E). In some implementations, rather than extending the leadframe extensions 102b, 104b across the entire leadframe cell 100, the leadframe extensions 102b, 104b can be fabricated to a length which provides connections to a very small die using a standard wire bonding (e.g., same signal pattern) layout.

Figure 4A:
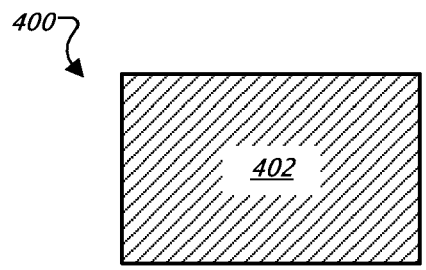
FIGS. 4A through 4C illustrate top, bottom and bottom edge views, respectively, of an example molded and singulated DFN package with internally extended package leads.
Figure 4B:
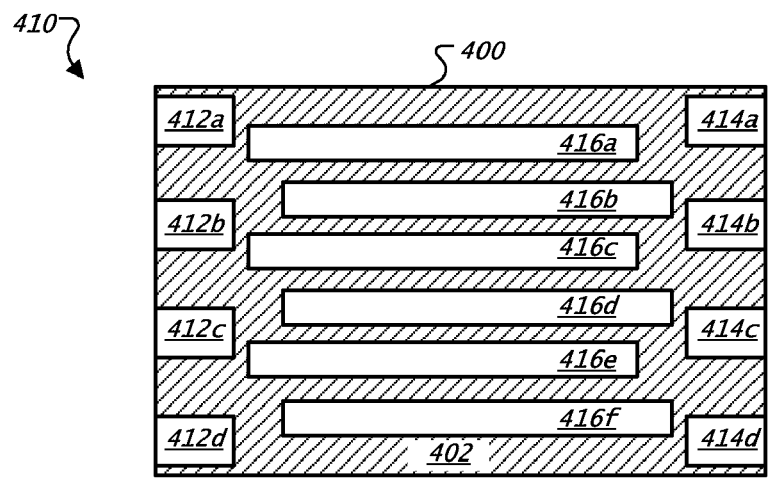
Figure 4C:
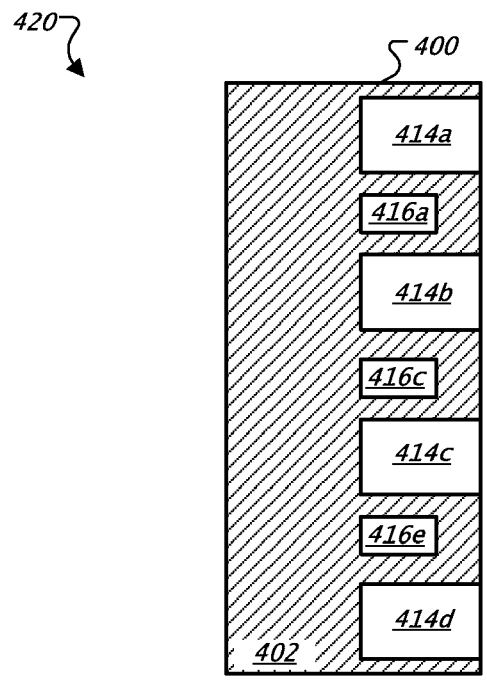

FIGS. 4A through 4C illustrate a molded and singulated DFN package with internally extended package leads. For example, the package 400 could have been fabricated using the steps illustrated in FIGS. 2A through 2F. A top view, as illustrated in FIG. 4A, shows the DFN package 400 coated in a mold compound 402 (e.g., epoxy). Flipping the DFN package 400 over, a bottom view 410 of the DFN package 400 shows a series of attach pads 412, 414 and exposed package portions 416.

The exposed package extensions 416 correspond to the extended portions 102b, 104b of the extended package leads 102, 104 which are of full leadframe thickness. For example, the exposed package extension 416a corresponds to the extended portion 104b of the upper right package pad 104a-1. Similarly, the exposed package extension 416b corresponds to the extended portion 102b of the upper middle left package pad 102a-2, the exposed package extension 416c corresponds to the extended portion 104b of the upper middle right package pad 104a-2, the exposed package extension 416d corresponds to the extended portion 102b of the lower middle left package pad 102a-3, the exposed package extension 416e corresponds to the extended portion 104b of the lower middle right package pad 104a-3, and the exposed package extension 416f corresponds to the extended portion 102b of the bottom left package pad 102a-4 (e.g., region 108 as illustrated in FIG. 1B).

The extended portions 102b, 104b of package pads 102a, 104a which are of full leadframe thickness are visible within the exposed package extensions 416. The extended portions 102b, 104b of the package pads 102a, 104a which have been reduced in thickness (e.g., etched to half of the leadframe thickness) are encompassed within the mold compound 402. In this manner, the mold compound 402 creates a non-conductive barrier between the attach pads 412, 414 and the exposed package extensions 416. If, for example, the solder overflows while the attach pads 412, 414 are being affixed to additional circuitry (e.g., printed circuit board (PCB), additional semiconductor device, etc.), the mold compound 402 acts as a solder mask between the attach pads 412, 414 and the exposed package extensions 416.

A bottom edge view of the package 400, as shown in FIG. 4C, illustrates attach pads 414 and exposed package extensions 416a, 416c, and 416e. The exposed package extensions 416a, 416c, and 416e, for example, are electrically and physically connected to the signal connections supplied by the terminating ends of the upper three extended portions 104b of package pads 104b-1, 104b-2, 104b-3 (e.g., as shown in FIG. 1A). The mold compound 402 electrically segregates the exposed package extensions 416a, 416c, and 416e from the attach pads 414. In some implementations, if the extended portions 102b, 104b of the package pads 102a, 104a are not extended across the entire leadframe design, the terminating ends of the extended portions 102b, 104b can be fully encompassed within the mold compound 402.

Example Fabrication Process

Figure 5:
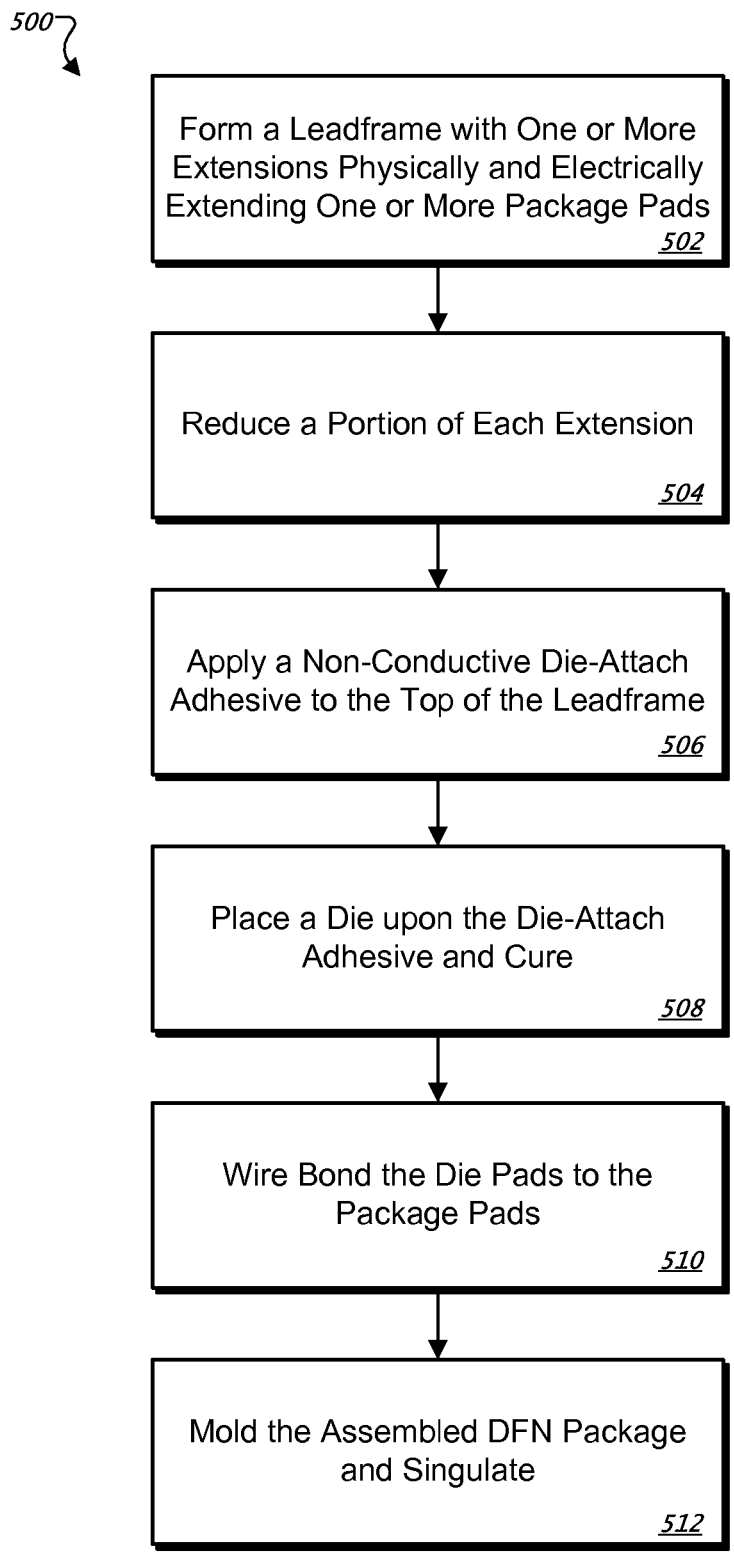
FIG. 5 is a flow diagram illustrating an example process for fabricating and assembling a DFN package with internally extended package leads.

FIG. 5 is a flow diagram illustrating a process 500 for fabricating and assembling a DFN package with internally extended leads. The process 500 begins with forming a leadframe cell, including one or more extended leads which have package pads and extended portions (502). Each extended portion physically and electrically extends a pad portion of the extended lead to an opposite edge of the package. In some implementations, the leadframe cell can be fabricated in the pattern of the leadframe cell 100 as shown in FIG. 1A. The leadframe cell, for example, can be created as part of a strip of leadframe cells organized upon a tie-bar matrix. The tie-bar matrix provides physical stability to the extension features of the leadframe cell during the assembly process.

At least some extended portions of the leadframe cell have a reduced leadframe thickness (e.g., reduced to about one half the thickness of the leadframe cell) (504). In some implementations, extended portions are etched from the bottom edge of the leadframe cell to reduce the thickness. For example, the edge view of the leadframe cell 100, as shown in FIG. 1B, illustrates an extended portion 104b which has been reduced in thickness.

A non-conductive die-attach adhesive is applied to the top of the leadframe cell (506). For example, a non-conductive die-attach paste or film can be applied to the top of the leadframe cell where a die will be mounted, as shown by the die-attach adhesive 202 in FIG. 2A.

A die is placed on top of the die-attach adhesive and cured to the leadframe cell (508). The die 204 as shown in FIG. 2C, for example, can be mounted on top of the die-attach adhesive 202 and cured to the leadframe cell 100. The die is oriented, in some implementations, so that the die-attach bond pads (e.g., bond pads 206 in FIG. 2C) are aligned with the orientation of the package pads (e.g., pads 102a, 104a as shown in FIG. 1A) of the leadframe cell.

One or more die pads are connected to the leadframe package pads (510). In some implementations, the die-attach bond pads (e.g., bond pads 206 in FIG. 2E) are electrically connected to the package pads (e.g., pads 102a, 104a as shown in FIG. 2E) by wire bonds (e.g., wire bonds 208 as shown in FIG. 2E) using a standard wire bonding technique and a shortest distance line-of-sight connection. The wire bonds are positioned so that they do not cross adjacent wires or otherwise risk electrical shorting.

If the die-attach pads are oriented in a manner different than the desired layout of the signals applied to the package pads, in some implementations the die-attach pads can be connected (e.g., via wire bonds) to one or more extension portions of the extended portions of the extended leads. For example, as shown in FIG. 3A, the die-attach pads 206 can be wire bonded to the extended portions 102b, 104b of the package pads 102a, 104a to switch the leftmost signals of the die 204 to the rightmost pads 104a of the leadframe cell 100 and vice versa. In some implementations, each die-attach pad 206, where possible, is wire bonded to a portion of the extended portion 102b, 104b which has full leadframe thickness.

The assembled DFN package is molded and singulated (512). For example, the assembled leadframe cell can be coated in a mold compound, such as an epoxy as shown by the mold compound 402 coating the DFN package 400 in FIG. 4A. The mold compound electrically isolates the package pads from the leadframe extension features. For example, the mold compound coats the portions of the leadframe extensions which are etched to half thickness, leaving the full thickness extension features (e.g., extensions 416 as shown in FIG. 4B) and the package attach pads (e.g., attach pads 414 as shown in FIG. 4B) exposed. The assembled DFN package can then be singulated, for example, by sawing or punching the individual packages, freeing each package from the tie-bar frame. At this point, the mold compound provides physical stability to the leadframe extensions.

While this document contains many specific implementation details, these should not be construed as limitations on the scope of what may be claimed, but rather as descriptions of features that may be specific to particular embodiments. For example, the geometric proportions of the leadframe cell 100 as described in FIG. 1A are provided by example only and are not intended to limit the potential geometric pattern and/or proportion of a leadframe cell fabricated with extended leadframe design. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

A number of implementations have been described. Nevertheless, it will be understood that various modifications may be made. For example, steps of one or more processes may be combined, deleted, modified, or supplemented to form further processes. As yet another example, the process steps depicted in the figures do not require the particular order shown to achieve desirable results. In addition, other steps may be provided, or steps may be eliminated, from the described processes, and other materials may be added to, or removed from, the described processes. Accordingly, other implementations are within the scope of the following claims.

What is claimed is:

1. A leadframe for an integrated circuit package, comprising:
 a number of internally extended package leads arranged in a plane along a first axis of the plane, wherein the extended package leads are electrically separated from each other along the first axis, the extended package leads having package pads and extended portions, the extended portions extending from the package pads along a second axis of the plane that is substantially perpendicular to the first axis, the extended portions being electrically connected to the package pads, tips of a plurality of extended portions extending to an edge of the leadframe and terminating at least partially between adjacent package pads, such that each tip and the respective adjacent package pads are intersected by a straight vertical line drawn between the tip and the respective adjacent package pads.

2. The leadframe of claim 1, where at least one extended portion includes a partially etched portion along a third axis that is substantially perpendicular to the plane, the partially etched portion having a first thickness that is less than a second thickness associated with the leadframe.

3. The leadframe of claim 1, where the leadframe is fabricated using one or more of copper, copper alloy, aluminum, brass and iron-nickel alloy.

4. An integrated circuit package, comprising:
 a leadframe including a number of internally extended package leads arranged in a plane along a first axis of the plane, wherein the extended package leads are electrically separated from each other along the first axis, the extended package leads having package pads and extended portions, the extended portions extending from the package pads along a second axis of the plane that is substantially perpendicular to the first axis, the extended portions being electrically connected to the package pads, tips of a plurality of extended portions extending to an edge of the leadframe and terminating at least partially between adjacent package pads, such that each tip and the respective adjacent package pads are intersected by a straight vertical line drawn between the tip and the respective adjacent package pads; and
 an integrated circuit die disposed on the leadframe, at least one bond pad of the integrated circuit die electrically coupled to a package pad or an extended portion of the leadframe based on a signal layout of the integrated circuit die.

5. The package of claim 4, where at least one extended portion includes a partially etched portion along a third axis that is substantially perpendicular to the plane, the partially etched portion having a first thickness that is less than a second thickness associated with the leadframe.

6. The package of claim 4, where the leadframe is fabricated using one or more of copper, copper alloy, aluminum, brass and iron-nickel alloy.

7. The package of claim 4, where at least one bond pad of the integrated circuit die is electrically coupled to a package pad or an extended portion of the leadframe using a wire bond.

8. A method of fabricating an integrated circuit package, comprising:
 forming a leadframe, the leadframe having a number of internally extended package leads arranged in a plane along a first axis of the plane, wherein the extended package leads are electrically separated from each other along the first axis, the extended package leads having package pads and extended portions, the extended portions extending along a second axis of the plane that is substantially perpendicular to the first axis, the extended portions being electrically connected to the package pads, tips of a plurality of extended portions extending to an edge of the leadframe and terminating at least partially between adjacent package pads, such that each tip and the respective adjacent package pads are intersected by a straight vertical line drawn between the tip and the respective adjacent package pads;
 reducing a thickness of an extended portion of at least one extended package lead along a third axis that is substantially perpendicular to the plane;
 bonding an integrated circuit die to the leadframe; and
 wire bonding at least one bond pad of the integrated circuit die to a pad portion or an extended portion based on a signal layout of the integrated circuit die.

9. The method of claim 8, wherein the leadframe is fabricated using one or more of copper, copper alloy, aluminum, brass and iron-nickel alloy.

* * * * *